(12) United States Patent
Watanabe

(10) Patent No.: US 10,680,514 B2
(45) Date of Patent: Jun. 9, 2020

(54) POWER SUPPLY CIRCUIT

(71) Applicant: ABLIC Inc., Chiba-shi, Chiba (JP)

(72) Inventor: Kotaro Watanabe, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/526,484

(22) Filed: Jul. 30, 2019

(65) Prior Publication Data

US 2020/0052584 A1 Feb. 13, 2020

(30) Foreign Application Priority Data

Aug. 10, 2018 (JP) ................. 2018-151545

(51) Int. Cl.
| | |
|---|---|
| *H02M 3/07* | (2006.01) |
| *H02J 9/00* | (2006.01) |
| *H02M 3/156* | (2006.01) |
| *H03K 17/687* | (2006.01) |
| *H02J 9/06* | (2006.01) |
| *H02M 1/00* | (2006.01) |

(52) U.S. Cl.
CPC ............ *H02M 3/07* (2013.01); *H02J 9/005* (2013.01); *H02J 9/061* (2013.01); *H02M 3/156* (2013.01); *H03K 17/6871* (2013.01); *H02M 2001/0045* (2013.01)

(58) Field of Classification Search
None
See application file for complete search history.

(56) References Cited

U.S. PATENT DOCUMENTS

| | | | | | |
|---|---|---|---|---|---|
| 6,150,798 | A | * | 11/2000 | Ferry ....................... | G05F 1/56 323/273 |
| 6,903,538 | B2 | * | 6/2005 | Umeda ................... | H02M 3/07 323/268 |
| 7,609,039 | B2 | * | 10/2009 | Hasegawa ........... | H02M 3/1588 323/273 |
| 7,759,916 | B2 | * | 7/2010 | Kleveland ............... | G05F 1/563 323/268 |
| 10,454,376 | B1 | * | 10/2019 | Watanabe ............. | H02M 3/157 |
| 2004/0027099 | A1 | | 2/2004 | Fujii | |

FOREIGN PATENT DOCUMENTS

JP 2002-112457 A 4/2002

\* cited by examiner

*Primary Examiner* — Jeffery S Zweizig
(74) *Attorney, Agent, or Firm* — Brinks Gilson & Lione

(57) ABSTRACT

A power supply circuit including an input terminal, an output terminal, a power output circuit, and a mode selection circuit. In the power supply circuit, the mode selection circuit is configured to supply a signal indicating whether the power output circuit is operated as a charge pump-type power output circuit or a series regulator-type power output circuit, and a voltage applied from the input terminal is stepped up or down by the power output circuit and then provided to the output terminal.

2 Claims, 2 Drawing Sheets

POWER SUPPLY CIRCUIT

RELATED APPLICATIONS

Priority is claimed on Japanese Patent Application No. 2018-151545, filed on Aug. 10, 2018, the content of which is incorporated herein by reference.

BACKGROUND OF THE INVENTION

1. Field of the Invention

The present invention relates to a power supply circuit.

2. Description of the Related Art

A configuration disclosed in Japanese Patent Application Laid-open No. 2002-112457 is known as a power supply circuit of the related art. FIG. 2 is a diagram for illustrating a power supply circuit 110 which is an example of a conventional power supply circuit and is substantially disclosed in Japanese Patent Application Laid-open No. 2002-112457.

A power supply circuit 110 includes a power output circuit 120, a power output circuit 140, a switch 111, a switch 112, an operation mode detecting circuit 160, a backflow prevention diode 141, an input terminal IN2, and an output terminal OUT2. The power supply circuit 110 causes the operation mode detecting circuit 160 to monitor an output current. If the operation mode detecting circuit 160 detects a large output current, the operation mode detecting circuit 160 connects a path connecting between the input terminal IN2 and the output terminal OUT2 by switching on the switches 111 and 112 to bring the power output circuit 120 into an operation state. The power supply circuit 110 causes both the power output circuit 120 and the power output circuit 140 to operate and supply an electric current to an output terminal OUT2. Further, if the operation mode detecting circuit 160 detects a small output current, the operation mode detecting circuit 160 disconnects the path by switching off the switches 111 and 112 to bring the power output circuit 120 into a sleep state. The power supply circuit 110 causes only the power output circuit 140 to operate and supply an electric current to the output terminal OUT2.

The power supply circuit 110 can switch an operation state and a sleep state of the power output circuit 120 based on an amount of the output current, and hence a highly efficient power supply operation can be performed. The power output circuit 120 is configured by a switching regulator. The power output circuit 140 is configured by a series regulator. The power supply circuit 110 includes a backflow prevention diode 141 to prevent an electric current from flowing from an output terminal of the power output circuit 120 to the output terminal of the power output circuit 140. The backflow prevention diode 141 is provided at the output terminal of the power output circuit 140.

SUMMARY OF THE INVENTION

It is therefore an object of the present invention to provide a power supply circuit that ensures high power supply efficiency.

According to at least one embodiment of the present invention, there is provided a power supply circuit including: a mode selection circuit; an input terminal; an output terminal; and a power output circuit configured to operate in one of a first mode and a second mode based on a signal from the mode selection circuit, the power output circuit including a first transistor and a second transistor which are connected in series between the input terminal and the output terminal, a third transistor and a fourth transistor which are connected in series between the input terminal and a ground terminal, a first capacitor connected between a first connection point between the first transistor and the second transistor and a second connection point between the third transistor and the fourth transistor, a second capacitor connected between the output terminal and the ground terminal, a control circuit configured to supply each control signal to each of the first to fourth transistors in the first mode and supply a control signal which switches on the second transistor and switches off the third and fourth transistors in the second mode, and an error amplifier circuit configured to compare a reference voltage and a voltage obtained by dividing a voltage between the output terminal and the ground terminal, the error amplifier circuit containing an output port which is connected to the control circuit in the first mode and to the first transistor in the second mode.

According to at least one embodiment of the present invention, there is provided a power supply circuit including: a mode selection circuit; an input terminal; an output terminal; a power output circuit configured to operate in one of a first mode and a second mode based on a signal from the mode selection circuit, the power output circuit including a first transistor and a second transistor which are connected in series between the input terminal and the output terminal, a third transistor and a fourth transistor which are connected in series between the input terminal and a ground terminal, a first capacitor connected between a first connection point between the first transistor and the second transistor and a second connection point between the third transistor and the fourth transistor, a second capacitor connected between the output terminal and the ground terminal, a control circuit configured to supply each control signal to each of the first to fourth transistors in the first mode and supply a control signal which switches off the third and fourth transistors in the second mode, an error amplifier circuit configured to compare a reference voltage and a voltage obtained by dividing a voltage between the output terminal and the ground terminal and to supply a signal to each of the first and second transistors in the second mode, and the error amplifier circuit containing an output port which is connected to the control circuit in the first mode and to the first and second transistors in the second mode.

The power supply circuit according to at least one embodiment of the present invention enables a single power output circuit to perform a power supply operation as one of a charge pump-type power output circuit and a series regulator-type power output circuit. The power supply circuit according to at least one embodiment of the present invention does not include a device causing a voltage drop, such as a switch and a backflow prevention diode, between a power output circuit and an output terminal, and hence power supply efficiency can be improved.

DETAILED DESCRIPTION OF THE PREFERRED EMBODIMENTS

Now, an embodiment of the present invention is described with reference to the drawings.

Figure 1:
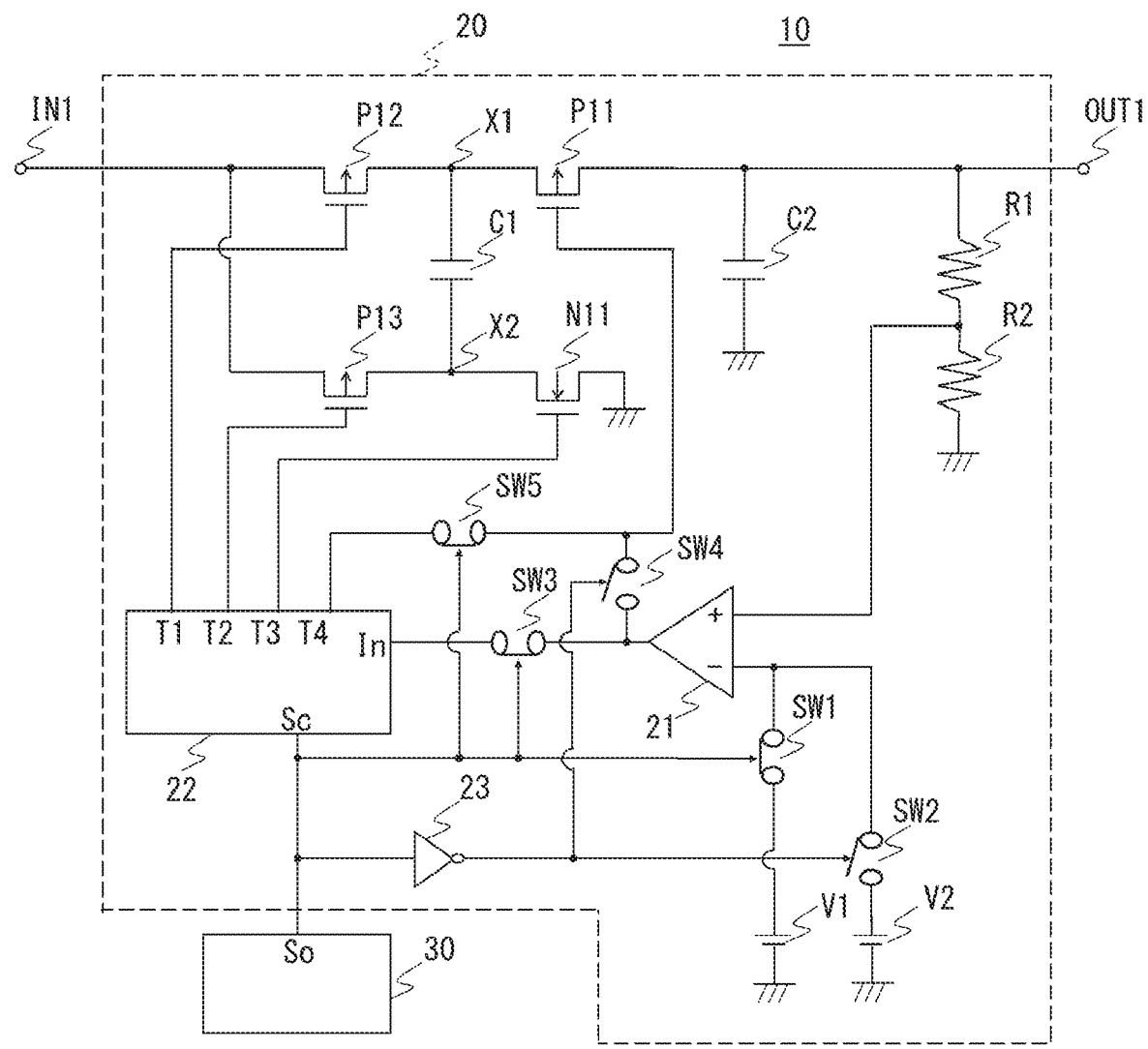
FIG. 1 is a diagram for illustrating a power supply circuit according to one embodiment of the present invention.
Figure 2:
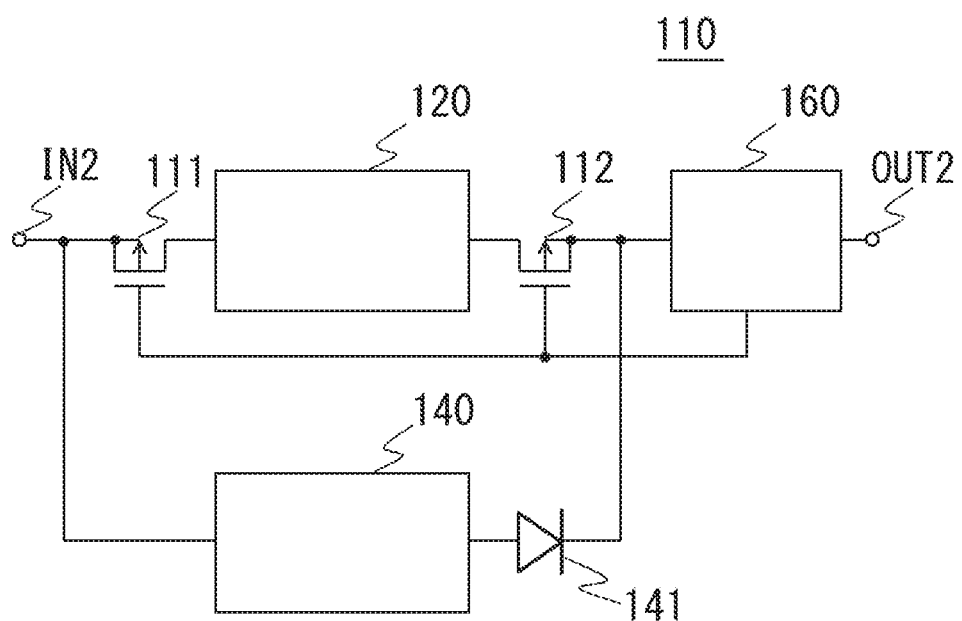
FIG. 2 is a diagram for illustrating an example of conventional power supply circuit.

FIG. 1 is a diagram for illustrating a power supply circuit 10 serving as a power supply circuit according to the embodiment of the present invention in detail. The power supply circuit 10 includes a power output circuit 20, a mode selection circuit 30, an input terminal IN1, and an output terminal OUT1.

The power output circuit 20 includes PMOS transistors P11, P12, and P13, an NMOS transistor N11, an error amplifier circuit 21, a control circuit 22, an inverter 23, resistors R1 and R2, capacitors C1 and C2, reference voltage circuits V1 and V2, and switches SW1, SW2, SW3, SW4, and SW5.

The power output circuit 20 is configured to operate as a charge pump-type power output circuit corresponding to a first mode through use of the PMOS transistors P11, P12, and P13, the NMOS transistor N11, the capacitors C1 and C2, the resistors R1 and R2, the reference voltage circuit V1, the error amplifier circuit 21, and the control circuit 22 containing terminals T1 to T4, In, and Sc. The power output circuit 20 is also configured to operate as a series regulator-type power output circuit corresponding to a second mode through use of the PMOS transistor P11, the resistors R1 and R2, the reference voltage circuit V2, and the error amplifier circuit 21.

The mode selection circuit 30 contains a terminal So, and is configured to supply from the terminal So a signal indicating whether the power output circuit 20 is to be operated in the first mode or in the second mode.

Described next is how to connect components of the power output circuit 20. The input terminal IN1 is connected to a source of the PMOS transistor P12 and a source of the PMOS transistor P13. A drain of the PMOS transistor P12 is connected to a first end of the capacitor C1 and a source of the PMOS transistor P11. A connection point X1 is a node at which the drain of the PMOS transistor P12, the first end of the capacitor C1, and the source of the PMOS transistor P11 are respectively connected. A gate of the PMOS transistor P12 is connected to the terminal T1. A drain of the PMOS transistor P13 is connected to a second end of the capacitor C1 and a drain of the NMOS transistor N11. A connection point X2 is a node at which the drain of the PMOS transistor P13, the second end of the capacitor C1, and the drain of the NMOS transistor N11 are respectively connected. A gate of the PMOS transistor P13 is connected to the terminal T2. A drain of the PMOS transistor P11 is connected to a first end of the capacitor C2, a first end of the resistor R1, and the output terminal OUT1, and a gate thereof is connected to a first end of the switch SW4 and a first end of the switch SW5. A source of the NMOS transistor N11 is connected to the ground terminal, and a gate thereof is connected to the terminal T3. A second end of the capacitor C2 is connected to the ground terminal. A second end of the resistor R1 is connected to a first end of the resistor R2 and a non-inversion input port of the error amplifier circuit 21. A second end of the resistor R2 is connected to the ground terminal. An inversion input port of the error amplifier circuit 21 is connected to a first end of the switch SW1 and a first end of the switch SW2, and an output port thereof is connected to a first end of the switch SW3 and a second end of the switch SW4. A first end of the reference voltage circuit V1 is connected to a second end of the switch SW1 and a second end thereof is connected to the ground terminal. A first end of the reference voltage circuit V2 is connected to a second end of the switch SW2 and a second end thereof is connected to the ground terminal. The terminal In is connected to a second end of the switch SW3, the terminal T4 is connected to a second end of the switch SW5, and the terminal Sc is connected to the terminal So, an input port of the inverter 23, and each control ports of the switches SW1, SW3, and SW5. An output port of the inverter 23 is connected to control ports of the switches SW2 and SW4.

If the power output circuit 20 receives a signal to be used to select the first mode from the terminal So of the mode selection circuit 30, the switches SW1, SW3, and SW5 are switched on and the switches SW2 and SW4 are switched off. The control circuit 22 is configured to supply a control signal described below to the PMOS transistors P11, P12, and P13 and the NMOS transistor N11. The control circuit 22 includes, e.g., an oscillator circuit and a level shifter, and is configured to provide from the terminals T1 to T4 a signal to be used to perform on/off control of the PMOS transistors P11, P12, and P13 and the NMOS transistor N11 based on a signal received through the terminal In. The inversion input port of the error amplifier circuit 21 is connected to the reference voltage circuit V1. The error amplifier circuit 21 is configured to amplify a difference between a reference voltage of the reference voltage circuit V1 and a voltage obtained by dividing a voltage of the output terminal OUT1 by the resistors R1 and R2, and to supply the amplified one from the output port of the error amplifier circuit 21 to the terminal In. Specifically, the control circuit 22 operates on/off control of the PMOS transistors P11, P12, and P13 and the NMOS transistor N11 so that the voltage divided by the resistors R1 and R2 becomes equal to the reference voltage of the reference voltage circuit V1.

An operation of the charge pump-type power output circuit corresponding to the first mode is described in detail below. The control circuit 22 is configured to supply a signal to be used to switch on the PMOS transistor P12 and the NMOS transistor N11 and switch off the PMOS transistors P11 and P13 so as to charge the capacitor C1 with a voltage applied from the input terminal IN1. Further, the control circuit 22 is configured to supply a signal to be used to switch off the PMOS transistor P12 and the NMOS transistor N11 and switch on the PMOS transistors P11 and P13 so as to charge the capacitor C2 with the sum of the voltage applied from the input terminal IN1 and the voltage charged in the capacitor C1. The voltage charged in the capacitor C2 is provided from the output terminal OUT1. Further, the voltage charged in the capacitor C2 is divided by the resistors R1 and R2, compared to a voltage of the reference voltage circuit V1 by the error amplifier circuit 21, and then fed back to the control circuit 22. The power output circuit 20 is configured to repeat the above-mentioned operation to step up the voltage applied from the input terminal IN1 and then supply the resultant voltage to the output terminal OUT1.

If the power output circuit 20 receives a signal to be used to select the second mode from the terminal So, the switches SW1, SW3, and SW5 are switched off and the switches SW2 and SW4 are switched on. The control circuit 22 is configured to supply a signal to be used to switch on the PMOS transistor P12. The control circuit 22 is configured to supply a signal to be used to switch off the PMOS transistor P13 and the NMOS transistor N11. The gate of the PMOS transistor P11 is connected to the output port of the error amplifier circuit 21 via the switch SW4. The inversion input terminal of the error amplifier circuit 21 is connected to the reference voltage circuit V2.

An operation of the series regulator-type power output circuit corresponding to the second mode is described in detail below. The PMOS transistor P11 serves as an output transistor of the series regulator-type power output circuit. The PMOS transistor P11 is configured to receive, at the source thereof, a voltage applied from the input terminal IN1, and to step down the voltage applied from the source in accordance with a voltage applied from the gate, and to supply the resultant voltage from the drain to the output terminal OUT1. The voltage supplied to the output terminal OUT1 is divided by the resistors R1 and R2. The error amplifier circuit 21 amplifies a difference between a reference voltage of the reference voltage circuit V2 and the voltage obtained by dividing the voltage of the output terminal OUT1 by the resistors R1 and R2, and supplies the amplified one from the output port of the error amplifier circuit 21 to the gate of the PMOS transistor P11. Specifically, the error amplifier circuit 21 controls the gate of the PMOS transistor P11 so that the voltage divided by the resistors R1 and R2 becomes equal to the reference voltage of the reference voltage circuit V2. With this operation, the power output circuit 20 is configured to step down the voltage input to the input terminal IN1 and supplies the resultant voltage to the output terminal OUT1.

The power supply circuit 10 can perform a power supply operation as one of the step-up type of charge pump-type power output circuit and the step-down type of series regulator-type power output circuit based on the signal from the mode selection circuit 30. The power supply circuit 10 enables the shared use of the error amplifier circuit 21 and the resistors R1 and R2 regardless whether the power output circuit 20 operates in the first mode or the second mode to reduce a circuit scale thereof. The power supply circuit 10 can be configured without including a device causing a voltage drop, such as a switch and a backflow prevention diode, between the power output circuit 20 and the output terminal OUT1, and hence power supply efficiency can be improved.

The configuration of the power supply circuit 10 mentioned above is given by way of an example and thus can be modified. In this embodiment, the PMOS transistor P11 serves as the output transistor of the series regulator-type power output circuit, but the PMOS transistor P12 may serve as the output transistor of the series regulator-type power output circuit or the PMOS transistors P11 and P12 may both serve as the output transistor of the series regulator-type power output circuit. If the PMOS transistors P11 and P12 both serve as the output transistor of the series regulator-type power output circuit, the error amplifier circuit 21 is configured to control both the PMOS transistors P11 and P12 and the control circuit 22 is configured to switch off both the PMOS transistor P13 and the NMOS transistor N11.

What is claimed is:

1. A power supply circuit comprising:
a mode selection circuit;
an input terminal;
an output terminal; and
a power output circuit configured to operate in one of a first mode and a second mode based on a signal from the mode selection circuit, the power output circuit including a first transistor and a second transistor which are connected in series between the input terminal and the output terminal, a third transistor and a fourth transistor which are connected in series between the input terminal and a ground terminal, a first capacitor connected between a first connection point between the first transistor and the second transistor and a second connection point between the third transistor and the fourth transistor, a second capacitor connected between the output terminal and the ground terminal, a control circuit configured to supply each control signal to each of the first to fourth transistors in the first mode and supply a control signal which switches on the second transistor and switches off the third and fourth transistors in the second mode, and an error amplifier circuit configured to compare a reference voltage and a voltage obtained by dividing a voltage between the output terminal and the ground terminal, the error amplifier circuit containing an output port which is connected to the control circuit in the first mode and to the first transistor in the second mode.

2. A power supply circuit comprising:
a mode selection circuit;
an input terminal;
an output terminal; and
a power output circuit configured to operate in one of a first mode and a second mode based on a signal from the mode selection circuit, the power output circuit including a first transistor and a second transistor which are connected in series between the input terminal and the output terminal, a third transistor and a fourth transistor which are connected in series between the input terminal and a ground terminal, a first capacitor connected between a first connection point between the first transistor and the second transistor and a second connection point between the third transistor and the fourth transistor, a second capacitor connected between the output terminal and the ground terminal, a control circuit configured to supply each control signal to each of the first to fourth transistors in the first mode and supply a control signal which switches off the third and fourth transistors in the second mode, and an error amplifier circuit configured to compare a reference voltage and a voltage obtained by dividing a voltage between the output terminal and the ground terminal and to supply a signal to each of the first and second transistors in the second mode, the error amplifier circuit containing an output port which is connected to the control circuit in the first mode and to the first and second transistors in the second mode.

* * * * *